(12) United States Patent
Howell et al.

(10) Patent No.: US 6,852,427 B1
(45) Date of Patent: Feb. 8, 2005

(54) CHROMIUM-FREE ANTITARNISH ADHESION PROMOTING TREATMENT COMPOSITION

(75) Inventors: Leonard R. Howell, Vernon, CT (US); Szuchain F. Chen, Hamden, CT (US)

(73) Assignee: Olin Corporation, Waterburry, CT (US)

( * ) Notice: Subject to any disclaimer, the term of this patent is extended or adjusted under 35 U.S.C. 154(b) by 0 days.

(21) Appl. No.: 10/653,582

(22) Filed: Sep. 2, 2003

(51) Int. Cl.$^7$ .............................................. B32B 15/00
(52) U.S. Cl. ...................... 428/658; 428/607; 428/612; 428/675; 428/687; 428/901; 428/935
(58) Field of Search ................................ 428/607, 658, 428/675, 612, 687, 901, 935, 306.6, 209, 546, 548, 615

(56) References Cited

U.S. PATENT DOCUMENTS

| | | | |
|---|---|---|---|
| 2,080,520 A | 5/1937 | Westbrook | 204/18 |
| 4,299,671 A | 11/1981 | Tremmel et al. | 204/35 R |
| 4,387,006 A | 6/1983 | Kajiwara et al. | 204/32 |
| 4,765,871 A | 8/1988 | Hsu et al. | 204/44.2 |
| 5,022,968 A | 6/1991 | Lin et al. | 204/28 |
| 5,098,796 A | 3/1992 | Lin et al. | 428/607 |
| 5,230,932 A | 7/1993 | Chen et al. | 428/607 |
| 5,250,363 A | 10/1993 | Chen | 428/607 |
| 5,252,855 A * | 10/1993 | Ogawa et al. | 257/676 |
| 5,300,158 A * | 4/1994 | Chen et al. | 148/258 |
| 5,378,346 A | 1/1995 | Ashiru et al. | 205/244 |
| 5,449,951 A | 9/1995 | Parthasarathi et al. | 257/677 |
| 5,456,817 A | 10/1995 | Hino et al. | 205/125 |
| 5,552,234 A | 9/1996 | Kawasumi | 428/633 |
| 5,573,845 A | 11/1996 | Parthasarathi et al. | 428/306.6 |
| 5,582,709 A | 12/1996 | Oshima et al. | 205/176 |
| 5,700,362 A | 12/1997 | Yano et al. | 205/191 |
| 5,800,930 A * | 9/1998 | Chen et al. | 428/607 |
| 6,183,886 B1 * | 2/2001 | Chen et al. | 428/647 |

FOREIGN PATENT DOCUMENTS

DE   1496747   5/1969   ........... C23B/11/00

OTHER PUBLICATIONS

D.M. Barnes and C.N. Robinson, *The Impact of Ionic Impurities In Die Attach Adhesives On Device Performance,* Electronics Components Conference, Institute of Electrical and Electronics Engineers, pp. 68–72 (1984).

*Material Safety Data Sheet for "MI TIQUE 1791,"* Hubbard Hall Inc., (Oct. 8, 1986).

*Shin–Etsu Epoxy Molding Compounds: KMC Series,* Shin–Etsu Chemical Co., Ltd. (Mar. 1999).

*Moisture/Reflow Sensitivity Classification For Nonhermetic Solid State Surfaces Mount Devices,* JEDEC Solid State Technology Association, (Apr. 1999).

*Metallization Contamination,* Microelectronic Defects Database, CALCE and the University of Maryland, http://www.calce.umd.edu/general/demos/defects/ defects/ metcont.html (Printed Nov. 16, 2000).

* cited by examiner

*Primary Examiner*—Cathy F. Lam
(74) *Attorney, Agent, or Firm*—Todd E. Garabedian; Wiggin and Dana LLP

(57) ABSTRACT

The present invention is directed to an aqueous, antitarnish and adhesion promoting treatment composition, comprising: zinc ions; metal ions selected from the group consisting of tungsten ions, molybdenum ions, cobalt ions, nickel ions, zirconium ions, titanium ions, manganese ions, vanadium ions, iron ions, tin ions, indium ions, silver ions, and combinations thereof; and optionally, an electrolyte that does not contain potassium or sodium ions; wherein the treatment composition is substantially free of chromium, and wherein the treatment composition forms a coating on a substrate or material that enhances adhesion of a polymer to the material. The present invention is also directed to materials coated with the above treatment composition, and methods of coating materials using the above composition.

9 Claims, 2 Drawing Sheets

(a)

10000x ▬ 1 um (b)

10000x ▬ 1 um (c)

10000x ▬ 1 um

CHROMIUM-FREE ANTITARNISH ADHESION PROMOTING TREATMENT COMPOSITION

BACKGROUND OF THE INVENTION

1. Field of the Invention

The present invention is directed to tarnish-resistant and adhesion promoting treatment compositions, and more particularly to tarnish-resistant and adhesion promoting treatment compositions that are substantially free of chromium.

2. Brief Description of the Art

Tarnish resistance of metal and tenacious adhesion between metals and polymer has been long sought for various applications such as printed circuits, electronic packaging, automotive body trim (aluminum to PVC or ABS plastics, for example), steel belted tires, and paint or other polymeric coatings. For example, the tarnish resistance of Cu foil for printed circuit application is required for shelf life and to withstand the heat exposure during lamination and soldering in printed circuit processing. The antitarnish coatings also prevent the oxidation of Cu and reaction with the polymeric substrate upon humidity and temperature exposures during the service life of the parts. This function is critical to maintain a good bond between Cu and polymer. In terms of electronic packaging applications, good adhesion is required in an electrical connector between a metallic jack and the molded plastic insulating sheath that surrounds it. As a second example, the inner leads of a metallic leadframe may be encapsulated in a polymer molding resin in the assembly of an electronic package to house an integrated circuit.

The adhesion between a polymer resin and a metallic substrate is improved by coating the metallic substrate with a second metal that forms a more tenacious bond to the polymer resin. Suitable coatings include refractory oxide-forming metals such as nickel and nickel alloys, or intermetallic-forming coatings such as tin on a copper substrate. These coatings, as well as others, are disclosed in U.S. Pat. No. 4,888,449 to Crane et al., which is incorporated by reference in its entirety herein.

Currently, zinc/chromium (ZnCr)-containing coatings are widely used on copper foils and lead frames in electronic applications to improve the tarnish resistance and bond strength of metal to polymeric substrates. These coatings are typically electrodeposited in an alkaline solution containing NaOH, Zn and Cr(VI) ions to form a mixture of Zn/Cr oxides, which provide tarnish resistance.

U.S. Pat. No. 4,387,006 discloses a method of treating the surface of a copper foil used in printed wire boards. The copper foil is electrolytically treated in an aqueous solution of zinc chromate containing zinc ions and chromium (VI) ions and immersed in an aqueous solution containing aminosilane, sodium silicate, and/or potassium silicate.

U.S. Pat. Nos. 5,230,932; 5,098,796; and 5,022,968 disclose a technique and compositions for improving the tarnish and oxidation resistance of copper and copper-based alloy materials. The material is electrolytically coated by immersion in an aqueous electrolyte containing NaOH, zinc ions and chromium (VI) ions. The coating provides tarnish resistance at temperatures in excess of 190° C.

U.S. Pat. No. 5,250,363 to Chen discloses a technique for improving the tarnish and oxidation resistance of a metallic substrate. The substrate is immersed in an aqueous solution containing NaOH, zinc ions, and chromium (VI) ions, and a chromium-zinc coating is electrolytically applied to the substrate. The coating provides tarnish resistance at temperatures in excess of 230° C., and is easily removable by immersion in sulfuric acid.

It is also claimed that under certain conditions, several of these coatings could reduce moisture penetration between lead frame and molding compound. This effect could greatly reduce the "pop corn effect," which is believed to be caused by formation of water vapor from accumulated moisture trapped under the die attach paddle when the device is subjected to a soldering temperature (e.g., temperatures of approximately 230° C.). This generation of water vapor is believed to be the cause of device failure due to cracks and delamination. Moreover, as industry moves away from solder containing lead and other toxic elements due largely to environmental concerns and tightening regulations, alternative solders are likely to have even higher soldering temperatures, and the attributes of metal/polymer adhesion will likely become more important.

Many compositions are known that provide for adhesion between a metal and a polymeric substance. U.S. Pat. No. 5,573,845 to Parthasarathi et al. discloses a composite material having a metallic core with a desired surface finish. An acicular (nodular) superficial coating layer having an apparent thickness of less than 275 angstroms is adjacent to at least a portion of the metallic core. The superficial coating layer is removable from the metallic core without appreciable change to the metallic core surface finish.

U.S. Pat. No. 5,449,951 to Parthasarathi et al. discloses a lead frame with enhanced adhesion to a polymer resin. The lead frame is coated with a thin layer containing chromium, zinc, or a mixture of chromium and zinc. The coated leadframe exhibits improved adhesion to a polymeric resin.

In International Publication Number WO 00/74131 A1 to Lee et al. a method of assembling a semiconductor device package is disclosed wherein a device/leadframe assembly is formed and then an adhesion enhancing coating is deposited on the exposed surfaces of the device/leadframe assembly, followed by encapsulation. The coating is a metallic coating which could be an inorganic Zn—Cr coating. This publication is specifically incorporated by reference herein in its entirety.

U.S. Pat. No. 5,252,855 to Ogawa et al discloses improving the adhesion between a copper base metallic substrate and a polymer resin by anodically oxidizing the substrate to form an aggregate of acicular crystals. Anodization of aluminum alloy substrates enhances the strength of a polymer bond as disclosed in U.S. Pat. No. 4,939,316 to Mahulikar et al. Other satisfactory coatings include oxidation resistant materials having a thickness of 300–5,000 angstroms as disclosed in U.S. Pat. No. 5,192,995 to Yamazaki et al.

As disclosed in the above art, sodium (Na) and/or potassium (K) ions are frequently used in immersion baths. However, sodium and potassium ions suffer a disadvantage in that these ions could potentially diffuse into the silicon die and cause failures in the produced devices. Such failures have been well documented (See, for example "Metallization Contamination," Microelectronic Defects Database, CALCE Electronic Products and Systems Center, University of Maryland, Apr. 12, 2000, identifying chloride and sodium contamination from molding compounds, die coatings, and die attach coatings; and Barnes and Robinson, "The Impact of Ionic Impurities in Die Attach Adhesives on Device Performance", Proceedings of 34th Electronics Components Conf., May, 1984, p. 68, identifying die attach adhesives as a particular source of ionic contamination).

In addition, the presence of Cr(VI) ions in a plating solution invokes environmental concerns in handling and disposal. Although Cr(VI)-containing plating baths have been used throughout the world for decades, the use of Cr(VI) is coming under increasing scrutiny due to growing concerns with health and environmental effects. Thus, it would be desirable to either replace a Cr(VI) plating bath with a less toxic Cr(III) bath, or eliminate the Cr entirely.

Thus there is a need in the art to provide aqueous adhesion promoting and tarnish resistance treatment compositions that are substantially free of chromium (VI) and that utilize optional electrolytes that do not contain potassium or sodium ions. The present invention is believed to be an answer to that need.

SUMMARY OF THE INVENTION

In one aspect, the present invention is directed to an aqueous, antitarnish and adhesion promoting treatment composition, comprising: zinc ions; metal ions selected from the group consisting of tungsten ions, molybdenum ions, cobalt ions, nickel ions, zirconium ions, titanium ions, manganese ions, vanadium ions, iron ions, tin ions, indium ions, silver ions, and combinations thereof; and optionally, an electrolyte that does not contain potassium or sodium ions; wherein the treatment composition is substantially free of chromium, and wherein the treatment composition is capable of forming a coating on a material, wherein the coating enhances adhesion of a polymer to the material.

In another aspect, the present invention is directed to a material coated with an antitarnish and adhesion treatment coating, comprising: zinc or zinc oxide atoms; and metal or metal oxide atoms selected from the group consisting of tungsten, molybdenum, cobalt, nickel, zirconium, titanium, manganese, vanadium, iron, tin, indium, silver, and combinations thereof; wherein the coating is substantially free of chromium, and wherein the coating provides a tarnish resistance at least for 30 min at 250° C., and wherein the coating contains nodular structures that enhance adhesion of a polymer to the material.

In yet another aspect, the present invention is directed to a method of forming a material coated with an antitarnish and adhesion promoting coating, comprising the steps of: contacting the material with an aqueous, antitarnish and adhesion promoting treatment composition, comprising: zinc ions; metal ions selected from the group consisting of tungsten ions, molybdenum ions, cobalt ions, nickel ions, zirconium ions, titanium ions, manganese ions, vanadium ions, iron ions, tin ions, indium ions, silver ions, and combinations thereof; and optionally, an electrolyte that does not contain potassium or sodium ions; wherein the treatment composition is substantially free of chromium; and passing an electric current through the treatment composition under conditions which deposit the antitarnish and adhesion promoting coating on the material to form the material coated with the antitarnish and adhesion promoting coating, wherein the coating enhances adhesion of a polymer to the material.

These and other aspects will be described in more detail in the following detailed description of the invention.

BRIEF DESCRIPTION OF THE FIGURES

The invention will be more fully understood from the following detailed description taken in conjunction with the accompanying drawings in which.

DETAILED DESCRIPTION OF THE INVENTION

Figure 1:
FIGS. 1(a), 1(b), and 1(c) show scanning electron micrographs (SEM) of surfaces treated in accordance with the compositions and methods of the present invention following 2, 5, and 10 second plating times, respectively.
Figure 1:
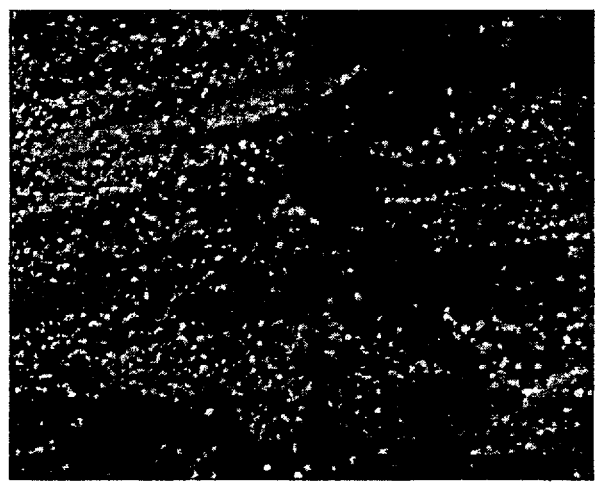
Figure 1:
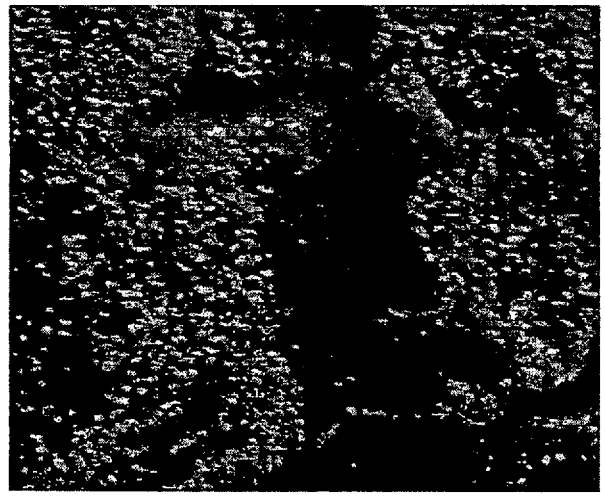

The present inventors have surprisingly found that it is possible to produce an aqueous, antitarnish and adhesion promoting treatment composition that permits formation of a tenacious bond between metals and polymers and addresses environmental and health effects regarding handling and disposal of such compositions. In accordance with the invention, the present inventors have now discovered an aqueous, antitarnish and adhesion promoting treatment composition that possesses improved bond adhesion between polymeric materials and metal, uses a Na/K-free plating solution to prevent contamination of a silicon die with such elements, and is substantially free of chromium (VI) to eliminate environmental and health implications in handling such solutions.

As indicated above, the present invention is directed to an aqueous, antitarnish and adhesion promoting treatment composition, comprising: (1) zinc ions; (2) metal ions selected from the group consisting of tungsten ions, molybdenum ions, cobalt ions, nickel ions, zirconium ions titanium ions, manganese ions, vanadium ions, iron ions, tin ions, indium ions, silver ions, and combinations thereof; and (3) optionally, an electrolyte that does not contain potassium or sodium ions; wherein said treatment composition is substantially free of chromium, and wherein said treatment composition forms a coating on a material or substrate that enhances adhesion of a polymer to the material or substrate. Each of these components is discussed in more detail below.

The zinc ion component of the treatment composition of the present invention can be derived from any zinc salt that allows formation of substantial amounts of zinc ions in aqueous solution. Examples of useful zinc salts include, but are not limited to, zinc sulfate, zinc oxide, zinc chloride, zinc fluoborate, zinc acetate, and combinations thereof. It is also understood that hydrates of the above zinc salts may also be employed in the composition of the present invention, either singly, or in combination. In one preferred embodiment, for example, the zinc salt is zinc sulfate heptahydrate ($ZnSO_4 \cdot 7H_2O$).

Preferably, the zinc ions are present in the composition of the invention from about 0.1 to about 100 g/L, and more preferably from about 0.5 to about 50 g/L, and most preferably from about 0.5 to about 20 g/L, all based on the total volume of the composition. In one preferred embodiment, the zinc salt is zinc sulfate heptahydrate ($ZnSO_4 \cdot 7H_2O$), and ranges from about 2 to about 80 g/L in the present composition.

The aqueous, antitarnish and adhesion promoting treatment composition of the present invention further includes metal ions which can form codeposits with zinc and result in an overall nodular structure being deposited on the surface of a material or substrate. Useful metal ions include tungsten ions, molybdenum ions, cobalt ions, nickel ions, zirconium ions, titanium ions, manganese ions, vanadium ions, iron ions, tin ions, indium ions, and silver ions. The metal ions may be employed singly, or in any combination, in the treatment composition of the present invention.

The metal ions may be derived from a corresponding metal salt, or a hydrate thereof, or a metal acid. Examples of metal salts or metal salt hydrates useful in the composition of the present invention include nickel sulfate or nickel sulfate hydrate, ammonium molybdate, molybdenum oxide, potassium permanganate, manganese sulfate, and combinations thereof. Examples of metal acids include molybdic acid, tungstic acid, tungstosilicic acid, and combinations thereof. In one preferred exemplary embodiment, the metal ions are molybdenum ions, tungsten ions, or a combination thereof. The invention is not limited to these examples and other metal salts, or hydrates there of, or metal acids, could be employed.

Preferably, the metal ions are present in the composition of the invention from about 5 to about 20,000 ppm, and more preferably from about 15 to about 2,000 ppm, and most preferably from about 25 to about 300 ppm, all based on the total parts of the composition.

In many instances, the zinc salt provides sufficient conductivity to the composition of the invention to permit deposition of zinc and metal ions onto a material or substrate. However, if the concentration of zinc salt is low, sufficient electrical conductivity may not exist for proper electrolytic deposition of the composition. In such cases, it is preferable to add an additional electrolyte to the treatment composition so that proper deposition can take place. Any water-soluble salt may be used as an electrolyte; however, it is desirable that such electrolyte does not contain sodium or potassium. As described in WO 00/74131, the presence of sodium or potassium ions in the aqueous plating composition results in diffusion of these ions into silicon dies treated in accordance with the teachings of WO 00/74131 and subsequent failures in the electronic devices. Therefore, electrolytes that are free of sodium or potassium are preferred.

Nonlimiting examples of useful electrolytes include ammonium sulfate, boric acid, citric acid, gluconic acid, rubidium hydroxide, ammonium chloride, and combinations thereof. In general, the electrolyte component comprises from about 1 g/L to about 500 g/L, and more preferably from about 5 g/L to about 200 g/L, and most preferably from about 10 g/L to about 50 g/L.

As indicated above, the aqueous, antitarnish and adhesion promoting treatment composition of the invention is substantially free of chromium. The presence of chromium only results from unavoidable contamination from the source chemicals or the environment. As defined herein, "substantially free of chromium" generally refers to levels of chromium lower than about 0.001% by weight, based on the total weight of the composition. Chromium (VI) has been shown to be toxic and suffers from environmental, health, and safety disadvantages. Thus, it is believed that the composition of the present invention, being substantially chromium free, does not suffer these disadvantages.

The treatment composition of the present invention can be made by mixing the proper amount of zinc and metal compounds, and optional electrolyte in water to establish the desired concentrations of each component. The pH of the solution is established by addition of an acid (e.g., boric acid, sulfuric acid, hydrochloric acid, citric acid, gluconic acid, and the like) or a base that does not contain sodium or potassium (e.g., calcium hydroxide, magnesium hydroxide, rubidium hydroxide, ammonium hydroxide, and the like). The preferred pH range for the treatment composition of the present invention is from about 0.5 to about 14.0; a more preferred pH range is from about 1.5 to about 13.5; a most preferred pH range is from about 2.5 to about 13.0. Additionally, if the composition of the invention has a pH in the neutral range (e.g., pH 5–9), a complexing agent such as the salts of citric acid or gluconic acid may be needed to maintain the metal ions in a soluble state in the plating solution.

In general, the chromium-free antitarnish adhesion promoting treatment composition of the invention may be implemented by known processes for applying a coating. For example, prior to coating a material or substrate, the material or substrate may be electrocleaned in a commercial alkaline cleaner or NaOH to remove any residual lubricant, oil, dirt, or surface oxides. An exemplary concentration of the cleaner is typically 30 g/l with a bath temperature of 130° F. and a current density of 30 asf (ampere per square foot) for 20 sec. However, any desired cleaning parameters could be employed as are known in the art. After the cleaning, the samples are dipped into a 5% sulfuric acid solution to activate the surface.

During deposition, the following conditions are desirable. The temperature of the plating bath during deposition preferably may range from about 100 to about 150° F., more preferably from about 110 to about 140° F., and most preferably from about 120 to about 140° F. The current density used during deposition may preferably range from about 2 to about 200 asf, more preferably from about 5 to about 100 asf, and most preferably from about 5 to about 30 asf. The deposition times preferably may range from about 1 to about 200 seconds, more preferably from about 2 to about 50 seconds, and most preferably from about 2 to about 20 seconds.

When deposited onto a material or substrate, the composition of the present invention forms a coating containing nodular structures as shown in FIGS. 1(a), 1(b), and 1(c). The thickness of the coating preferably ranges from about 15 to about 500 Angstroms, depending on the conditions of the deposition (discussed in more detail below). There are, on average, preferably from about 25 to about 1000 of the nodular structures per 16 square microns and most preferably the average density is from about 50 to about 500 nodular structures per square micron. The average length of each nodular structure is preferably from about 0.01 micron to about 1 micron, and more preferably the average length is from about 0.05 to about 0.5 microns. The preferred aspect ratio (length to diameter) is preferably from about 1:1 to about 8:1 and more preferably from about 2:1 to about 6:1.

It is believed that most of the nodular structures do not extend perpendicularly from the surface, but rather extend from the surface at a variety of angles, forming an interwoven mesh. A polymer flowing onto the voids between individual nodular structures follows a tortuous path between the interstices, and on solidification, the polymer appears to be mechanically locked in place. The coating layer also enhances adhesion of the material or substrate to a polymer. The presence of nodular structures on the substrate surface enhances mechanical locking of a polymer adhesive relative to a surface without the nodular structures. For example, a bond strength in the range of preferably greater than 1000 psi, and more preferably preferably 1100–2400 psi, depending on the type of polymer adhesive, can be obtained after the exposure of the samples to 85% RH/80–85° C. for 168 hr, followed by a thermal shock in approximately 260° C. solder for 120 sec. The coating layer is firmly bonded to the metallic substrate and not prone to separation at either the interface between the metallic substrate and the coating layer or within the coating layer itself as is typical with copper oxide coatings. Without the nodular antitarnish coating as described in this invention, the bond strength between the metal and polymer is typically less than one half of that described above.

The coating layer imparts oxidation resistance at temperatures at which the composite material may be exposed during storage, processing or use. These temperatures are typically up to about 250° C. While the coating layer has discontinuous voids and interstices, none extend completely through the coating layer or an oxidation site results. In addition to oxidation resistance, the coating layer provides corrosion resistance to dilute concentrations of chlorides, sulfides and other contaminants found in an industrial environment or on the fingers of an operator.

The antitarnish adhesion promotion coatings and methods of application described in this invention can be applied to any conductor and in any step of the process based on electrochemical principles. For examples, copper and copper alloys as well as nickel, iron, aluminum, steel, stainless steel, zinc, tin, silver, palladium, gold, titanium, carbon, and any other material or substrate that is conductive enough to pass the electrical current can be electroplated. In addition, even a nonconductor that has been metallized could also render itself to be electroplated. In another example, it is convenient to apply this antitarnish coating after the silver plating in a leadframe manufacturing process. If needed, this coating can be removed at the locations where wire bonding is required using a mask in the subsequent silver stripping process, which is typically applied to remove the back plating or spill-over plating of silver. Alternatively, this antitarnish coating can be applied after the IC chip attachment and wire bonding. This way, removal of this coating in the wire bond areas is not needed.

The present invention is further described in detail by means of the following Examples. All parts and percentages are by weight, and all temperatures are degrees Celsius unless explicitly stated otherwise.

EXAMPLES

Example 1

A C110 copper foil (>99.9% Cu and <0.05% O) was electrocleaned in a commercial alkaline cleaner to remove residual lubricant, contaminants, and oxides from the surface. The cleaned copper foil was then dipped in a solution containing 10 g/L $ZnSO_4.7H_2O$, 10 g/L $(NH_4)_2SO_4$ and 25 ppm W (tungsten, as tungstosilicic acid). A plating current of 10 amperes per square foot (ASF) was applied to an area of 0.035 $ft^2$ for 2, 5 and 10 second intervals. The sample was then rinsed and dried. FIGS. 1(a), 1(b), and 1(c) show scanning electron micrographs (SEMs) of the treated surfaces at the three time intervals. In each case, the nodular morphology is visible.

The copper foil sample was subjected to a tape test using a Scotch 600 tape. The tape was first pressed onto the plated surface and then pulled away from the surface. The glue was visibly left behind on the plated sample, indicating that a nodular structure was deposited onto the copper foil.

The sample was further subjected to a 250° C. bake for 30 minutes. The sample showed no oxidation after the bake, while an untreated portion was heavily oxidized. This result indicated that the deposited coating provided a good tarnish resistance. The baked sample was further subjected to the tape test using the Scotch 600 tape described above. The glue was visibly left behind on the plated sample, again indicating the presence of nodular structures on the surface of the copper foil.

Example 2

A C110 copper foil sample having pure copper dendrites on one side and bare on the other was dipped in 5 wt % $H_2SO_4$ for 30 seconds to remove any existing surface oxides. The sample was placed in a fixture that exposes only one surface to an aqueous plating composition containing 10 g/l $ZnSO_4.7H_2O$, 20 g/l $(NH_4)SO_4$ and 25 ppm W, and a plating current of 10 ASF was applied to an area of 0.104 $ft^2$ for 5 sec. The sample was then rinsed and dried. The procedure was repeated on a second sample exposing the opposite surface to the same solution and plating current. The samples were further subjected to a 95° C./55% RH test for 60-min to simulate a long-term storage in a hot and humid condition. The sample was subsequently baked for 30 min at 190° C. and showed no oxidation. The untreated portion was heavily oxidized. This indicated that the coating provided a good tarnish resistance.

Example 3

A C110 copper foil was electrocleaned in a commercial alkaline cleaner to remove the residual lubricant, contaminants, and oxides from the surface. A plating current of 5 ASF was applied to an area of 0.035 $ft^2$ for 5 sec in a solution containing 5 g/l $ZnSO_4.7H_2O$, 3 g/l $NiSO_4.6H_2O$, 50 ml $KMnO_4N/10$ and 2.5 ml/l MITIQUE (inorganic acid composition that contains 1–3% ammonium molybdate; Hubbard Hall, Waterbury, Conn.). The sample was then rinsed and dried, and subjected to a tape test using a Scotch 600 tape. The tape was first pressed onto the plated surface and then pulled away from the surface. The glue was visibly left behind on the plated sample. This result indicates that a nodular structure was deposited.

The sample was further subjected to a 250° C. ×10-min bake test and the sample showed no oxidation after the bake. The untreated portion was heavily oxidized. This result indicated that the coating provided a good tarnish resistance.

Example 4

A C7025 copper foil (foil (96.2% Cu, 3.0% Ni, 0.65% Si, and 0.15% Mg) having 0.03 inch thickness was electrocleaned in a commercial alkaline cleaner to remove the residual lubricant, contaminants, and oxides from the surface. A plating current of 10 ASF was applied to an area of 0.035 $ft^2$ for 10 sec in a solution containing 10 g/l $ZnSO_4.7H_2O$ and 1.5 ml/l MITIQUE. The sample was then rinsed and dried. Tape testing using Scotch 600 tape resulted in glue transfer to the treated surface, and indicated a nodular or roughened surface was obtained. Additional samples were plated, encapsulated using Sumicon 6300 molding compound and subjected to 168 hr 85% RH/85° C. moisture testing as described in Testing Standard IPC/JEDEC J-STD-020 A. After exposure the samples were solder floated for 120 sec at approximately 260° C. and adhesion strength measured in a pull test, where the encapsulated metal sample was pull apart from the mold compound and the separation force was registered using an Instron tensile tester. Little loss of bond strength was found to occur when compared to samples not exposed to the temperature/humidity. In comparison, the samples without the nodular treatment typically lost more than 50% of its original bond strength.

Example 5

A C110 copper foil was electrocleaned in a commercial alkaline cleaner to remove the residual lubricant, contaminants, and oxides from the surface. A plating current of 10 ASF was applied to an area of 0.035 $ft^2$ for 10 sec in a solution containing 10 g/l $ZnSO_4.7H_2O$ and 45 ppm $MoO_3$. The sample was then rinsed and dried, and subjected to a tape test using a Scotch 600 tape. The tape was first pressed onto the plated surface and then pulled away from the surface. The glue was visibly left behind on the plated sample. This result indicates that a nodular structure was deposited.

The sample was further subjected to a 250° C.×10-min bake test and the sample showed no oxidation after the bake. The untreated portion was heavily oxidized. This result indicated that the coating provided a good tarnish resistance.

Example 6

Figure 2:
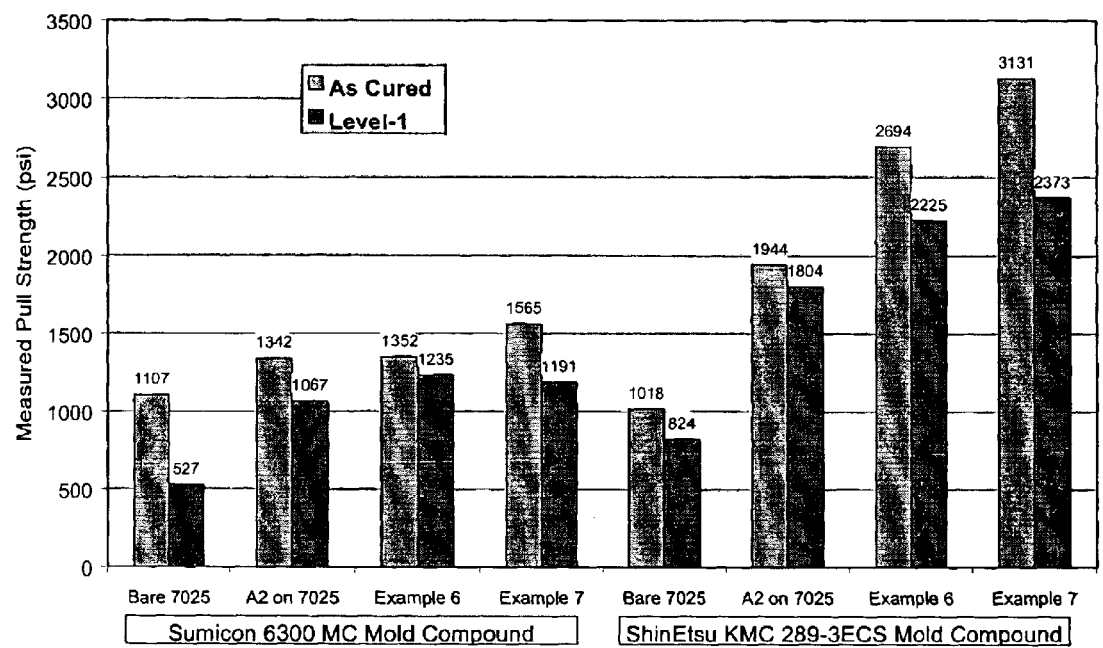
FIG. 2 shows bar graphs depicting various surface treatments and their effect on bond strength between mold compound and the treated surfaces.

A C7025 copper foil having 0.03 inch thickness was electrocleaned in a commercial alkaline cleaner to remove the residual lubricant, contaminants, and oxides from the surface. A plating current of 10 ASF was applied to an area of 0.035 ft$^2$ for 10 sec in a solution containing 10 g/l $ZnSO_4.7H_2O$ and 30 ppm Mo (as molybdic acid). The sample was then rinsed and dried, and subjected to a tape test using Scotch 600 tape. The tape testing resulted in glue transfer to the treated surface, and indicated a nodular or roughened surface was obtained. Additional samples were plated, encapsulated using Sumicon 6300 and Shinetsu KMC-289-3ECS molding compounds subjected to 168 hr 85% RH/85° C. moisture testing as described in IPC/JEDEC J-STD-020A. After exposure the samples were solder floated for 120 sec at approximately 260° C., and adhesion strength measured. As shown in FIG. 2, little loss of bond strength was found to occur when compared to non-exposed samples.

Example 7

A C7025 copper foil having 0.03 inch thickness was electrocleaned in a commercial alkaline cleaner to remove the residual lubricant, contaminants, and oxides from the surface. A plating current of 10 ASF was applied to an area of 0.035 ft$^2$ for 5 sec in a solution containing 15 g/l $ZnSO_4.7H_2O$, 15 g/l $(NH_4)_2SO_4$ and 25 ppm W (as tungstosilicic acid). The sample was then rinsed and dried, and subjected to a tape test using a Scotch 600 tape. The tape was first pressed onto the plated surface and then pulled away from the surface. The glue was visibly left behind on the plated sample. This result indicates that a nodular structure was deposited.

The sample was further subjected to a 250° C. ×30-min bake test and the sample showed no oxidation after the bake. The untreated portion was heavily oxidized. This result indicated that the coating provided a good tarnish resistance.

Additional samples were plated, encapsulated using Sumicon 6300 and Shineto KMC-289-3ECS molding compounds subjected to 168 hr 85% RH/85° C. moisture testing as described in IPC/JEDEC J-STD-020A. After exposure, the samples were solder floated for 120 sec at approximately 260° C., and adhesion strength measured. As shown in FIG. 2, no loss of bond strength was found to occur when compared to non exposed samples.

Example 8

C7025 copper foil having 0.03 inch thickness was electrocleaned in a commercial alkaline cleaner to remove the residual lubricant, contaminants, and oxides from the surface. A plating current of 5 ASF was applied to an area of 0.0352$^2$ ft for 4 sec in a solution containing 12.5 g/l NaOH, 2.25 g/l zinc and 0.65 g/l W. The sample was then rinsed and dried. The sample was subjected to a tape test using Scotch 600 tape. The tape was first pressed onto the plated surface and then pulled away from the surface. The glue was visibly left behind on the plated sample. This result indicates that a nodular structure was deposited.

The sample was further subjected to a 250° C.×30-min bake test and the sample showed no oxidation after the bake. The untreated portion was heavily oxidized. This result indicated that the coating provided a good tarnish resistance.

While the invention has been described in combination with embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims. All patent applications, patents, and other publications cited herein are incorporated by reference in their entireties.

What is claimed is:

1. A material coated with an antitarnish and adhesion treatment coating, said antitarnish and adhesion treatment coating comprising zinc or zinc oxide atoms; and metal or metal oxide atoms selected from the group consisting of tungsten, molybdenum, cobalt, nickel, zirconium, titanium, manganese, vanadium, iron, tin, indium, silver, and combinations thereof;

wherein said coating is substantially free of chromium, and wherein said coating provides a tarnish resistance at least for 30 min at 250° C., and wherein said coating contains nodular structures that enhance adhesion of a polymer to said material.

2. The coated material of claim 1, wherein said material comprises a material selected from the group consisting of copper, copper alloy, nickel, iron, aluminum, steel, stainless steel, zinc, tin, silver, palladium, gold, titanium, carbon, metallized non-conductors, and combinations thereof.

3. The coated material of claim 1, wherein the thickness of said coating on said material ranges from about 15 to about 500 Angstroms.

4. The coated material of claim 1, wherein said coating contains from about 25 to about 1000 of said nodular structures per 16 square microns.

5. The coated material of claim 1, wherein said nodular structures each have an average length in the range of from about 0.01 micron to about 1 micron, and an aspect ratio (length to diameter) of from about 1:1 to about 8:1.

6. The coated material of claim 1, wherein said enhanced adhesion comprises greater than 1000 psi following exposure of said coated substrate to 85% RH/80–85° C. for 168 hr, followed by a thermal shock in approximately 260° C. solder for 120 sec.

7. The coated material of claim 1, comprising a coated substrate.

8. The substrate of claim 7, comprising an electronic device.

9. The substrate of claim 7, comprising a device/leadframe assembly.

* * * * *